United States Patent
Wu

[11] Patent Number: 6,060,749
[45] Date of Patent: May 9, 2000

[54] ULTRA-SHORT CHANNEL ELEVATED S/D MOSFETS FORMED ON AN ULTRA-THIN SOI SUBSTRATE

[75] Inventor: Shye-Lin Wu, Hsinchu, Taiwan

[73] Assignee: Texas Instruments - Acer Incorporated, Hsinchu, Taiwan

[21] Appl. No.: 09/065,472

[22] Filed: Apr. 23, 1998

[51] Int. Cl.[7] .................................................. H01L 27/12
[52] U.S. Cl. .......................... 257/347; 257/410; 257/639; 257/649; 257/900
[58] Field of Search ................................. 257/347, 410, 257/411, 649, 639, 900

[56] References Cited

U.S. PATENT DOCUMENTS

| | | | |
|---|---|---|---|
| 5,296,727 | 3/1994 | Kawai et al. | 257/347 |
| 5,349,228 | 9/1994 | Neudeck et al. | 257/347 |
| 5,418,391 | 5/1995 | Huang | 257/347 |
| 5,475,244 | 12/1995 | Koizumi et al. | 257/347 |
| 5,550,397 | 8/1996 | Lifshitz et al. | 257/412 |
| 5,557,126 | 9/1996 | Cunningham | 257/347 |
| 5,567,966 | 10/1996 | Hwang | 257/347 |
| 5,684,318 | 11/1997 | Ayres et al. | 257/347 |
| 5,693,959 | 12/1997 | Inoue et al. | 257/347 |
| 5,729,039 | 3/1998 | Beyer et al. | 257/347 |
| 5,736,751 | 4/1998 | Mano et al. | 257/347 |
| 5,925,918 | 7/1999 | Wu et al. | 257/413 |

OTHER PUBLICATIONS

Sze, S.M., "Semiconductor Devices Physics and Technology," pp. 405, 1985.

*Primary Examiner*—David Hardy
*Attorney, Agent, or Firm*—Harness, Dickey & Pierce, P.L.C.

[57] ABSTRACT

The present invention includes a SOI structure formed in a substrate. A gate is formed over the substrate in a recessed portion of a substrate. A first isolation structure is formed on the side walls of the gate. A second isolation structure is formed adjacent to the first isolation structure. Source and drain regions are formed on the SOI structure. Lightly doped drain (LDD) structures are formed adjacent to the source and drain regions, on the SOI structure and under the second isolation structure. A first metal silicide layer is formed on the source and drain regions and a second metal silicide layer is formed on the gate.

4 Claims, 5 Drawing Sheets

ULTRA-SHORT CHANNEL ELEVATED S/D MOSFETS FORMED ON AN ULTRA-THIN SOI SUBSTRATE

The present invention relates to a semiconductor device, and more specifically, to a method of fabricating a metal oxide semiconductor field effect transistor (MOSFET) having ultra-short channel and elevated source and drain on an ultra-thin SOI substrate.

BACKGROUND OF THE INVENTION

The semiconductor industry has recently advanced in an everfaster brisk pace. In order to achieve high performance integrated circuits or high package density of a wafer, the sizes of semiconductor devices have become smaller and smaller than before in the field of Ultra Large Scale Integrated (ULSI) technologies. Integrated circuits include more than a million devices in a specific area of a wafer and electrically connecting structure for connecting these devices to perform desired function. One of the typical devices is metal oxide semiconductor field effect transistor (MOSFET). The MOSFET has been widely; traditionally applied in the semiconductor technologies. As the trend of the integrated circuits, the fabrication of the MOSFET also meets various issues to fabricate them. The typical issue that relates to hot carriers injection is overcome by the development of the lightly doped drain (LDD) structure.

The thin film silicon on insulator (SOI) structure is of interest due to potentially alleviated short channel effects. Further this fulfills the requirement of the devices towards high driving capability. For deep sub-micron meter MOS devices, the SOI (silicon on insulator) is an ideal structure for forming the MOS devices. At present the thin film on the SOI structure plays an important role in the evolution of the semiconductor technologies due to the requirement of the low operation power and power consumption. Further, the fully-depleted (FD) SOI MOS offers a higher driving capability, reduced parasitic capacitance and reduced short channel effects as compared to the bulk or partially (PD) SOI MOS. One device that has been proposed for ultra-low voltage operation is a configuration of a PD SOI structure. An article relating to the SOI is "Thin Film Silicon on Insulator: An Enabling Technology", by Michael Alles, et al., Semiconductor international, p. 67, 1997. One of the methods to form the SOI structure is called SIMOX (separation by implantation of oxygen). The method involves the implantation of oxygen ions into a substrate, followed by the step of a high temperature anneal. Wafer bonding is another low cost primary means for forming the SOI structure. Two wafers respectively have oxide on the surfaces. The two wafer are bound together by joining at room temperature, followed by an anneal to strengthen the bond.

However, the high series source and drain (S/D) resistance of the thin FD SOI transistors will limit the device performance. Su has proposed a method to reduce the series resistance in "Optimization of Series Resistance in Sub-0.2 $\mu$m SOI MOSFET'S", L. K. Su et al., IEEE, Electron Device Lett., vol. EDL-15, P. 145, 1994. One of the solutions is the use of silicide to reduce the S/D sheet resistance. Su used the titanium/cobalt silicidation to overcome the issue. Also, it is difficult to define the gate length to below 0.1 $\mu$m due to the limit of current optical lithography. Please refer to "Short-Channel-Effect-Suppressed Sub-0.1-$\mu$m Grooved-Gate MOSFET'S with W Gate", S. Kimura et al., IEEE Trans. Electron Device Lett., vol. ED-42, P. 94, 1995. In the paper, Kimura disclosed a grooved-gate Si MOS with tungsten gates to suppress the short channel effect.

SUMMARY OF THE INVENTION

The structure according to the present invention includes a SOI structure formed in a substrate and keep a space from a surface of the surface of the substrate. A gate is formed over the substrate in a recessed portion of a substrate. A first isolation structure is formed on the side walls of the gate and under the gate. A second isolation structure is refilled in the recessed portion, and on adjacent to the first isolation structure. Source and drain regions are formed on the SOI structure adjacent to the second isolation structure. Lightly doped drain (LDD) structures are formed adjacent to the source and drain regions, on the SOI structure and under the second isolation structure. A first metal silicide layer is formed on the source and drain regions and a second metal silicide layer is formed on the gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method to fabricate an ultra-short channel elevated S/D MOSFET on an ultra-thin SOI (silicon on insulator) substrate. The MOS with ultra-short channel can be obtained by using spacers as an etching mask. The elevated silicide S/D contacts are used to reduce the parasitic resistance for achieving the high performance SOI devices. Further, the ultra-thin silicon layer for high SOI MOS can be obtained by means of the local oxidation. An article relating the matter is proposed by O. Faynot, "High Performance Ultrathin SOI MOSFET'S Obtained by Localized Oxidation", IEEE, Electron Device Lett., vol. EDL-15, P. 175, 1994. In the present invention, the short channel effect can be suppressed by using the elevated source and drain junction and ultra-short channel. The embodiment of the present invention will be seen as follows.

Figure 14:
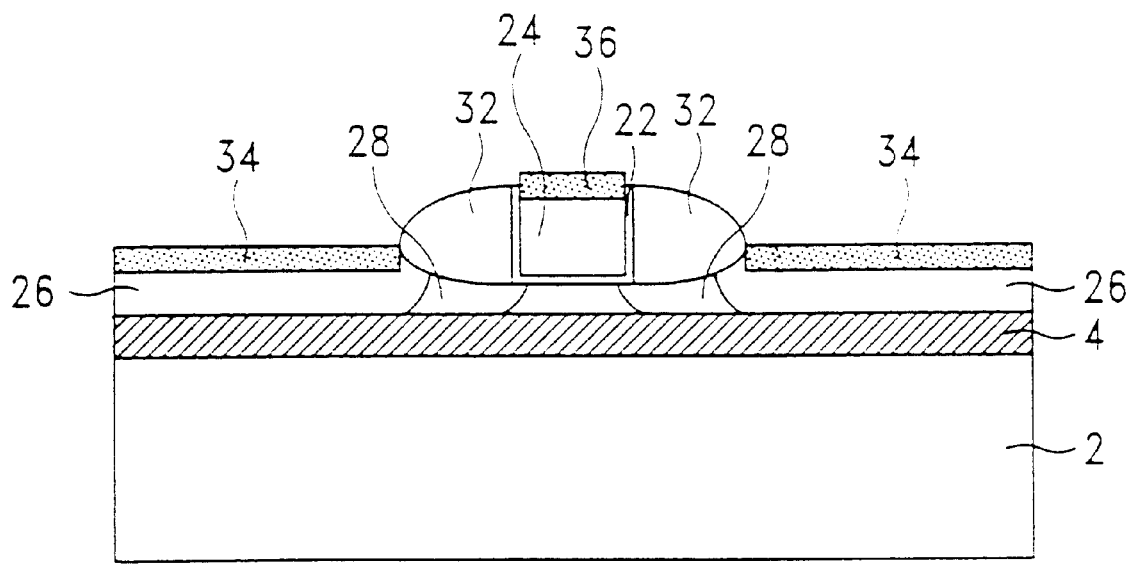
FIG. 14 is a cross-sectional view of a semiconductor wafer illustrating the step of performing a self-aligned silicide process according to the present invention.

The structure of the present invention can be seen in FIG. 14. A SOI structure 4 is formed in a substrate 2 and keep a space from the surface of the substrate 2. The substrate 2 has a recessed portion formed in a portion of the space. A gate 24 is formed over the substrate 2 in the central portion of the recessed portion. A first isolation structure 22 is formed on the side walls of the gate 24 and under the gate 24. The first isolation structure 22 is composed of silicon oxynitride. The portion of said first isolation under said gate serves as a gate insulator. A second isolation structure 32 is refilled in the recessed portion, and adjacent to the first isolation structure 22. Source and drain regions 26 are formed on the SOI structure 4 adjacent to the second isolation structure 32. Lightly doped drain (LDD) regions 28 are formed adjacent to the source and drain regions 26, on the SOI structure 4 and under the second isolation structure 32. The source and drain regions 26 are elevated due to the gate 24 is formed in the recessed portions. A first metal silicide layer 34 is formed on the source and drain regions 26 and a second metal silicide layer 36 is formed on the gate 24. The formation of the present invention can be seen as follows.

In a preferred embodiment, a single crystal silicon substrate 2 with a <100> crystallographic orientation is provided. The substrate 2 has a SOI structure 4 formed therein. There are various methods to form the SOI structure 4 in the substrate 2 as well known in the art. For example, the SIMOX (separation by implantation of oxygen) can be employed to achieve the buried insulator, i.e. the SOI structure 4. First, an ion implantation containing oxygen ions is performed to dope oxygen into the substrate 2. Then, a high temperature anneal is used to form the SOI structure 4 at a temperature about 1100 to 1350 degrees centigrade. A pad oxide layer 8 is then form on the surface of the substrate 2. Thus, a silicon structure 6 is created between the SOI structure 4 and the pad oxide 8. Typically, the pad oxide layer 8 is formed in oxygen ambient at a temperature of about 800 to 1100 centigrade degrees. In the embodiment, the thickness of the pad oxide layer 8 is approximately 15–250 angstroms. Alternatively, the pad oxide layer 8 may be formed using any suitable oxide chemical compositions and procedures, such as chemical vapor deposition.

Figure 1:
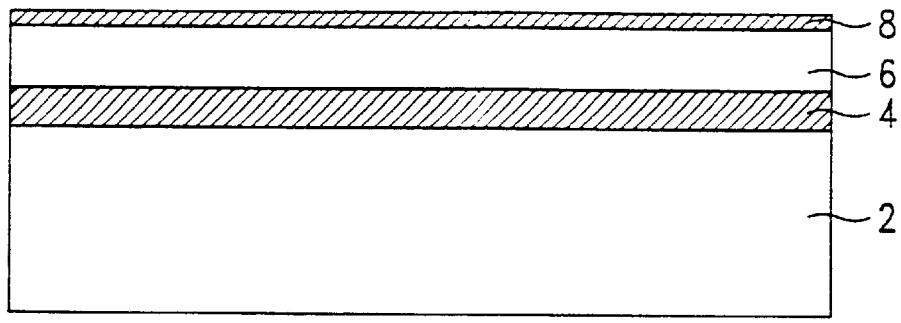
FIG. 1 is a cross-sectional view of a semiconductor wafer illustrating the steps of forming a buried oxide layer in a semiconductor substrate according to the present invention.
Figure 2:
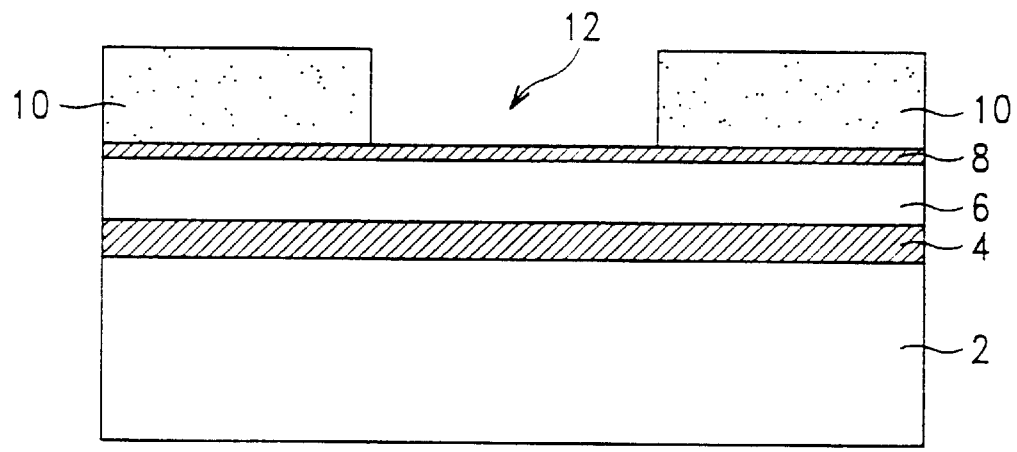
FIG. 2 is a cross-sectional view of a semiconductor wafer illustrating the step of patterning a silicon nitride layer according to the present invention.
Figure 3:
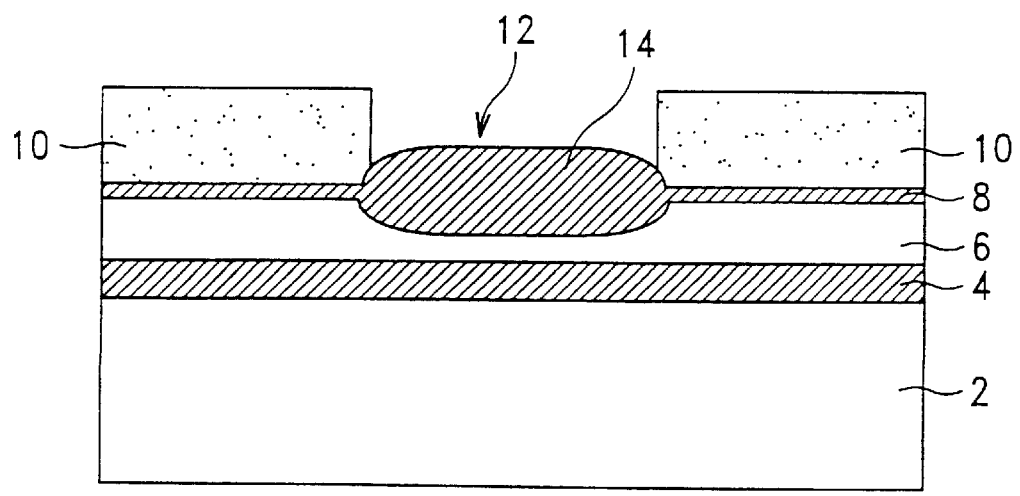
FIG. 3 is a cross-sectional view of a semiconductor wafer illustrating the step of forming a thermal oxide on the substrate according to the present invention.

Turning to FIG. 2, a silicon nitride layer 10 having an opening 12 is patterned on the surface of the pad oxide 8 to expose a portion of the pad oxide 8 and define the active area. Then, a thick field oxide (FOX) 14 is formed on the exposed pad oxide layer 8 by thermal oxidation. In a case, a thermal oxidation in steam environment is used to grow the FOX 14 to a thickness of about 1000–8000 angstroms, as shown in FIG. 3. The thickness of the silicon structure 6 under the FOX 14 is shrunk due to the local steam oxidation. The silicon structure 6 under the FOX 14 has a thinner portion and a thicker portion, the thicker portion being used to form a subsequent elevated source and drain.

Figure 4:
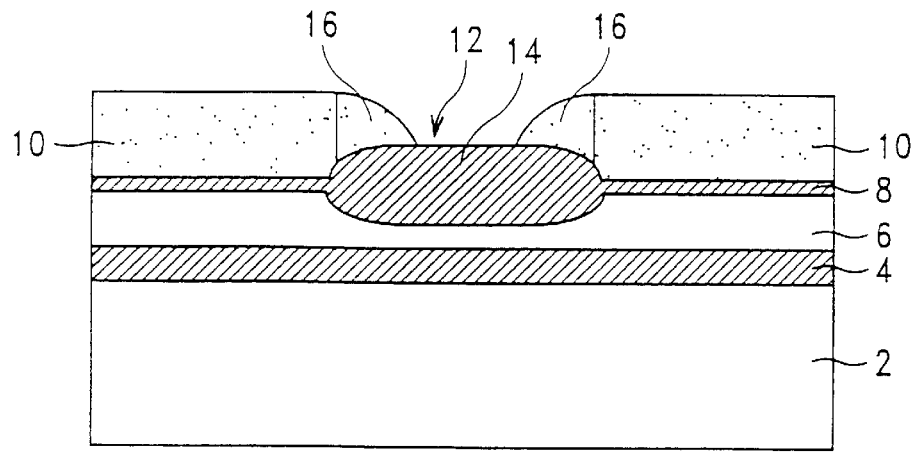
FIG. 4 is a cross-sectional view of a semiconductor wafer illustrating the step of forming spacers on side walls of silicon nitride layer according to the present invention.

Turning to FIG. 4, sidewall spacers 16 are formed on the side walls of opening 12. In order to achieve this, a thick dielectric layer is formed on the surface of the silicon nitride layer 10 and along the surface of the FOX 14, followed by an anisotropically etching. The spacers 16 expose a portion of the FOX 14. Preferably, the spacers 16 are formed of silicon nitride layer. Thus, the silicon nitride layer 10 and the spacers 16 can be simultaneously removed in one step for subsequent step.

Figure 5:
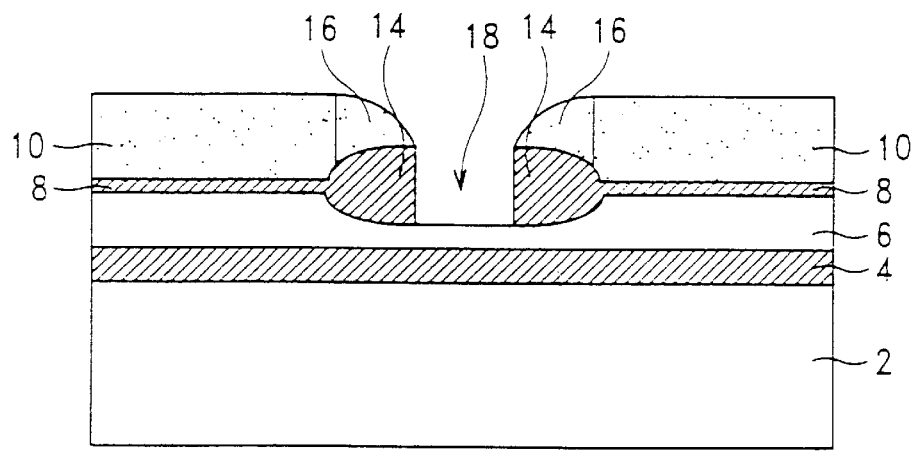
FIG. 5 is a cross-sectional view of a semiconductor wafer illustrating the step of etching the thermal oxide using the spacers as a mask according to the present invention.
Figure 6:
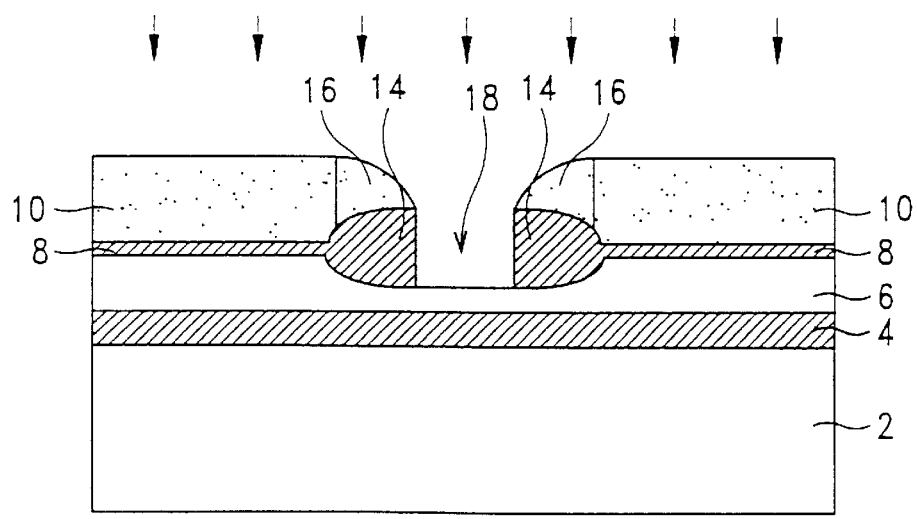
FIG. 6 is a cross-sectional view of a semiconductor wafer illustrating the step of performing an ion implantation according to the present invention.
Figure 7:
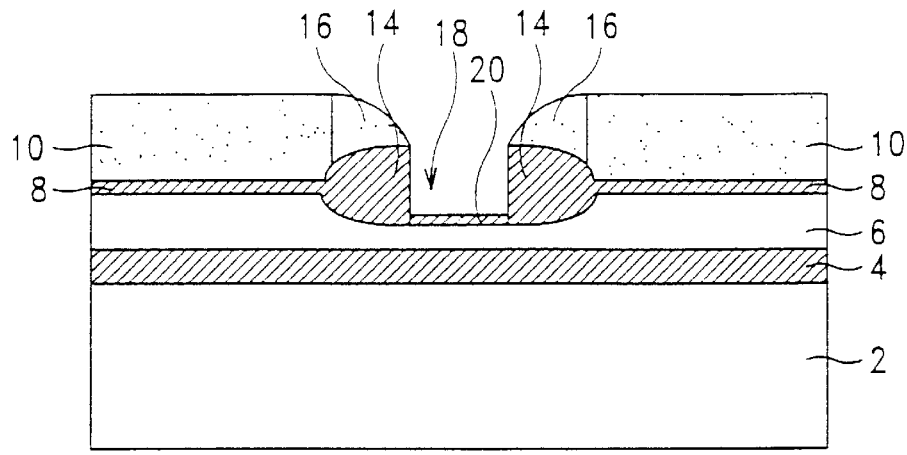
FIG. 7 is a cross-sectional view of a semiconductor wafer illustrating the step of performing a thermal oxidization according to the present invention.

Next, the exposed portion of the FOX 14 is etched using the spacers 16 as a mask, thereby exposing a portion of the silicon structure 6 and forming a deeper opening 18 in the FOX 14. The opening 12 is wider than the opening 18. The result is schemed in FIG. 5. Referring to FIG. 6, an ion implantation is performed through the opening 18 into the substrate for adjusting the threshold voltage and anti-punch-through implantation. For NMOS transistors, for example, the dopant of the ion implantation is B or $BF_2$ ions, and the dopant of the punch through stopping implantation is As, P or Sb ions. Further, the dosage and the ion implantation energy of the step are about 5E11 to 5E13 atoms/cm$^2$, and about 0.1 to 50 KeV, respectively. As shown in FIG. 7, a high temperature anneal is optionally performed in ambient containing $O_2$ or $N_2O$ to recover the etching damage. The temperature is approximately 750 to 1100 degrees centigrade. Simultaneously, a dielectric layer 20 (may be an oxide or an oxynitride layer) will be formed at the bottom of the opening 18 depend on the oxidation environment.

Figure 8:
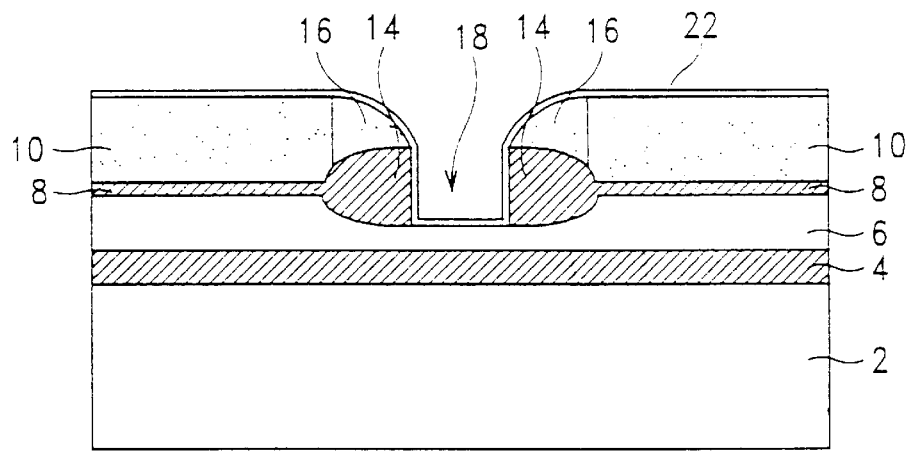
FIG. 8 is a cross-sectional view of a semiconductor wafer illustrating the step of forming a CVD oxynitride layer according to the present invention.
Figure 9:
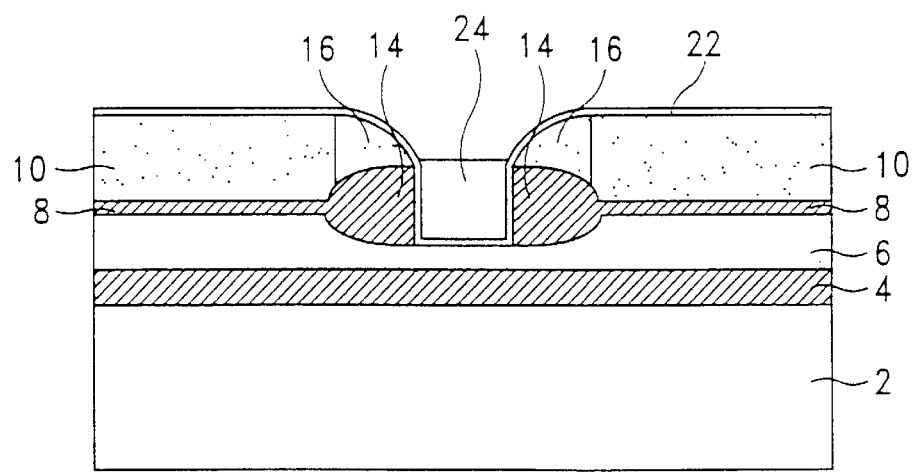
FIG. 9 is a cross-sectional view of a semiconductor wafer illustrating the step of forming a silicon gate according to the present invention.

Turning to FIG. 8, the dielectric layer 20 is removed. Subsequently, a thin CVD oxynitride layer 22 is deposited on the surface of the silicon nitride 10, spacers 16 and the opening 18. A low-pressure chemical vapor deposition (LPCVD) is introduced in the step. Turning next to FIG. 9, a polysilicon layer is then formed on the thin CVD oxynitride layer 22 and refilled into the opening 18. Then, the polysilicon layer is etched to left the layer in the opening 18, thereby generating a gate 24. The portion of the silicon oxynitride layer 22 under the gate 24 is used as the gate dielectric.

Figure 10:
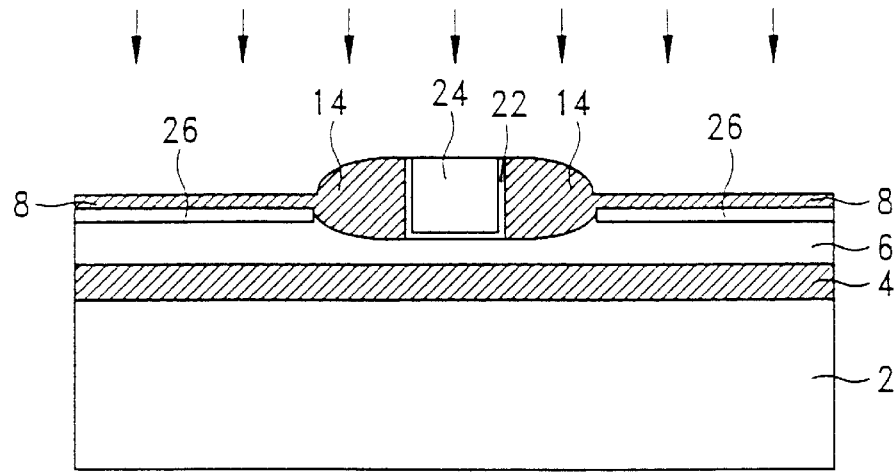
FIG. 10 is a cross-sectional view of a semiconductor wafer illustrating the step of performing the gate, source and drain implantation according to the present invention.
Figure 11:
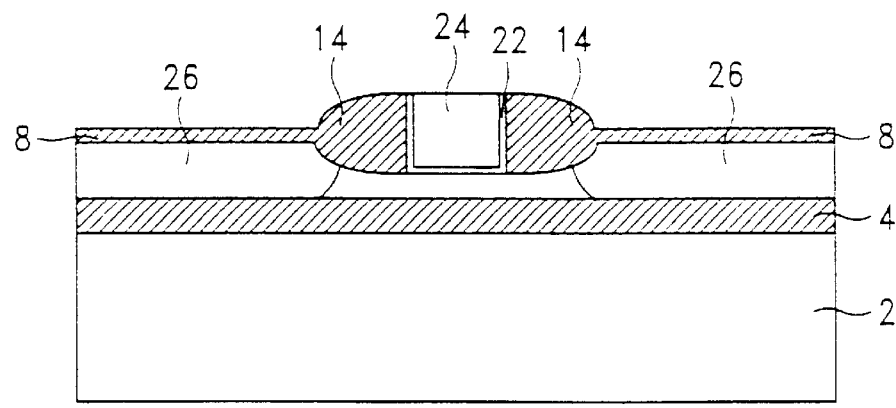
FIG. 11 is a cross-sectional view of a semiconductor wafer illustrating the step of activating the dopants according to the present invention.

Then, referring to FIG. 10, an etching technique is used to remove the CVD oxynitride layer 22, silicon nitride 10 and the spacers 16. Thus, the pad oxide 8 and the FOX 14 are exposed. Typically, the etchant containing $CF_4/H_2$, $CHF_3$, $CH_3CHF_2$ can be used for the etching. Source and drain regions 26 are next created in the silicon structure 6 by an implantation. The gate 24 is also doped by the step. The dosage of the ion implantation is about 1E 14 to 2E16 atoms/cm$^2$. The energy of the step is approximately 0.5 to 80 KeV. The dopants are subsequently activated by means of high temperature anneal in $O_2$ or $N_2O$ environment, as shown in FIG. 11. Preferably, the temperature is about 750 to 1100 degrees centigrade.

Figure 12:
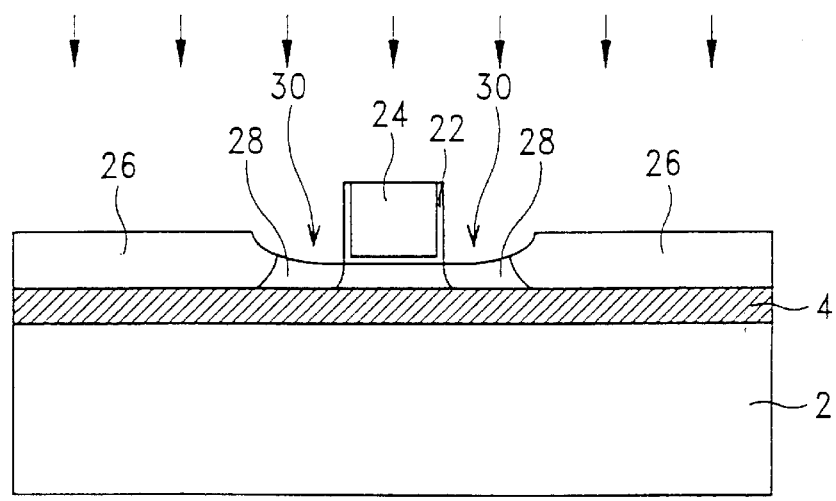
FIG. 12 is a cross-sectional view of a semiconductor wafer illustrating the steps of removing the thermal oxide and forming the LDD structure according to the present invention.

Referring to FIG. 12, the pad oxide layer 8 and the FOX 14 are then removed to expose the top of the substrate. Then, a blanket ion implantation with low energy and low dose is carried out to implant dopant into the substrate to form the lightly doped drain (LDD) regions 28 adjacent to the gate 24. The dosage and the ion implantation energy of the step are about 1E12 to 1E14 atoms/cm$^2$, about 0.5 to 60 KeV, respectively. Recessed portions 30 of the substrate are formed adjacent to the gate 24 after the FOX 14 is removed.

Figure 13:
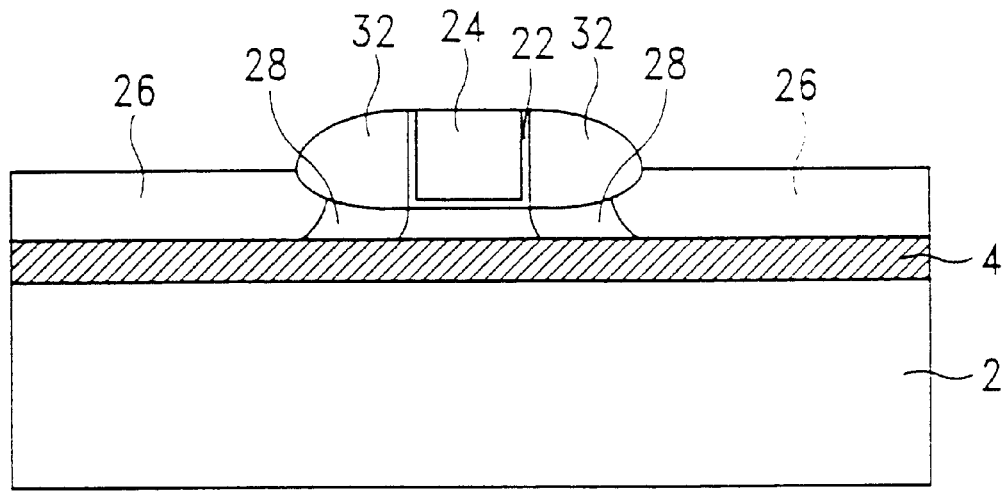
FIG. 13 is a cross-sectional view of a semiconductor wafer illustrating the step of forming oxide spacers according to the present invention.

Turning to FIG. 13, a thick oxide layer is formed on the substrate 2 by CVD, followed by etching the oxide layer to form spacers 32 on the side walls of the gate 24 and in the recessed portions 30.

As shown in FIG. 14, self-aligned silicide (SALICIDE) layer 34, polycide layer 36 are respectively formed on the source and drain 26 and on the gate 24. Typically, this can be achieved by using well-known processes. For example, a refractory or noble metal layer, such as Ti, Pt, Co, W, Ni etc, is deposited on the substrate 2, gate 24. Then, a first-step rapid thermal annealing (RTA) at 350 to 700 centigrade degrees in N$_2$ ambient is performed to react the refractory metal with the gate 24 and the substrate 2, thereby forming silicide on these portions to reduce the parasitic resistance. Then, a strip step is used to remove non-reacted refractory metal on spacers 32. Therefore, the SALICIDE layer 34, polycide layer 36 are self-aligned formed on these regions. The temperature of the step is about 750–1050 degrees centigrade.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A structure for forming a transistor with ultra short channel and elevated source and drain on a substrate, said structure comprising:

a silicon on insulator (SOI) structure formed in said substrate and said SOI structure keeping a space from a surface of said substrate, thereby creating a silicon layer formed thereon, wherein said substrate has a recessed portion formed in said silicon layer;

an oxide layer formed on said surface of said substrate;

a field oxide region formed on said recessed portion, said field oxide region having a first opening formed therein thereby exposing a portion of said silicon layer, wherein said opening is used for filling a gate therein, said silicon layer under said field oxide region having a thinner portion and thicker portions, wherein said thicker portion is used to form said elevated source and drain;

a mask structure having a second opening wider than said first opening formed on said oxide layer; and spacers formed on said field oxide and attached on side walls of said second opening, wherein said spacers and said mask structure are used in combination to form said first opening.

2. The structure of claim 1, wherein said mask structure is formed of nitride.

3. The structure of claim 1, wherein said spacers is formed of nitride.

4. The structure of claim 1, further comprising an oxynitride layer formed along a surface of said mask structure, said spacers and said second opening to act as a gate dielectric.

* * * * *